United States Patent [19]

Baumgartner

[11] Patent Number: 4,738,869
[45] Date of Patent: Apr. 19, 1988

[54] PHOTOSELECTIVE ELECTROLESS PLATING METHOD EMPLOYING UV-ABSORBING SUBSTRATES

[75] Inventor: Charles E. Baumgartner, Niskayuna, N.Y.

[73] Assignee: Pacific Bell, San Francisco, Calif.

[21] Appl. No.: 934,304

[22] Filed: Nov. 24, 1986

[51] Int. Cl.$^4$ .................. B05D 3/06; B05D 3/04; B05D 3/10; B05D 5/12

[52] U.S. Cl. .................. 427/54.1; 427/126.2; 427/304; 427/305; 437/173; 437/230

[58] Field of Search .............. 427/54.1, 304, 305, 427/125, 126.2

[56] References Cited

U.S. PATENT DOCUMENTS

| | | | |
|---|---|---|---|
| Re. 29,015 | 10/1976 | De Angelo et al. | 427/304 |
| 3,035,944 | 5/1962 | Sher et al. | 427/305 |
| 3,928,670 | 12/1975 | Brummett et al. | 427/306 |
| 4,084,968 | 4/1978 | Janssen et al. | 427/304 |

FOREIGN PATENT DOCUMENTS 0759617  8/1980  U.S.S.R. .................. 427/305

*Primary Examiner*—Norman Morgenstern
*Assistant Examiner*—Margaret Burke
*Attorney, Agent, or Firm*—Fitch, Even, Tabin & Flannery

[57] ABSTRACT

A process for photoselective electroless plating is disclosed in which a semiconductor substrate (e.g. barium titanate) capable of absorbing light having a wavelength greater than 300 nm is coated with a solution containing the salt of tin, titanium, or lead (e.g. $SnCl_2$). The coated substrate is then selectively exposed to light having a wavelength of 300–390 nm in a negative pattern; the light energy absorbed by the substrate is transferred to the coating, changing the oxidation state of the metal ion of the metal salt rendering it incapable of reducing palladium ions in a palladium chloride solution. Coating with a precious metal salt (e.g., $PdCl_2$) and nickel disposition follow the light exposure step.

7 Claims, No Drawings

PHOTOSELECTIVE ELECTROLESS PLATING METHOD EMPLOYING UV-ABSORBING SUBSTRATES

The present invention relates to the electroless plating of metals and more specifically to techniques in which the pattern of plated metal is determined by exposure to ultraviolet light.

There are a number of applications in which conductive material must be selectively applied to the surface of an insulating substrate. For example, piezo-electric actuators require that electrodes be attached to electrostrictive ceramics. These electrodes may be bonded to the ceramics; however, it is preferred that the electrodes be plated directly on the ceramic material.

There are a number of prior art techniques for the electroless plating of metal on insulating substrates. These processes are referred to as electroless because they do not require that an electrical current be passed through the object being plated. Typically, the spatial distribution of the plated metal on the surface of the substrate is determined by exposing the surface to ultraviolet light after coating the surface with a catalyst, referred to as a photo-promoter. The plating methods are often grouped into "positive" and "negative" methods. Positive methods are those in which metal will be plated in those regions exposed to the ultraviolet light. Negative methods are those methods in which metal will be deposited in those regions which are not exposed to the ultraviolet light.

DeAngeleo, et al. (U.S. Pat. No. 3,562,005) describe a method for selectively patterning metal onto an insulating substrate. In the methods described by DeAngeleo, et al., a photo-promoter such as stannous chloride is used as a photosensitive catalyst. In this procedure, a stannous chloride solution is applied to the surface of the material to be plated. The portions of the surface which are not to be plated are then exposed to ultraviolet light having a wavelength less than 300 nm. Following the exposure to the ultraviolet light, the surface is exposed to a salt of a precious metal such as palladium chloride. In those areas which were not exposed to the ultraviolet light, the following reaction takes place

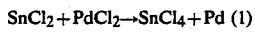

$$SnCl_2 + PdCl_2 \rightarrow SnCl_4 + Pd \quad (1)$$

The areas which were exposed to the ultraviolet light show no palladium formation, since the absorbed stannous chloride is photochemically oxidized to stannic chloride. The stannic chloride is unable to reduce the palladium ions in the palladium chloride to metallic palladium. Once the metallic palladium layer is formed, other metals may be electrolessly plated onto the locations covered by the palladium.

DeAngeleo, et al. describe photo-promoters comprising solutions of tin, titanium, or lead ions. The photo-promoter must have three features. First it must have two oxidation states. Second, ions in one oxidation state must be convertible to ions of the other oxidation state by ultraviolet light. And third, in one oxidation state (but not both) the photo-promoter must be able to reduce a precious metal to its metallic form from a salt solution of said precious metal. The reduced precious metal may then be used to catalyze an electroless plating process for the deposition of another metal of interest. DeAngeleo, et al. describe processes based on the precious metals palladium, platinum, gold, silver, osmium, indium, iridium, rhenium, and rhodium.

The primary disadvantage of this method, and other methods employing ultraviolet light, is the requirement that the surface to be plated be exposed to short wavelength ultraviolet light. For example, the photochemical oxidization of stannous chloride, and the other photo-promoters taught by DeAngeleo, et al., only takes place at wavelengths less than 300 nm. Typically, the 254 nm mercury emission line is used as the light source. The masks and optics used in creating the ultraviolet light pattern on the surface of the substrate must be transparent to this wavelength of ultraviolet light. As a result, special materials must be used for both the masks and optics. The cost of these special materials makes this process economically unattractive for many plating applications.

Broadly, it is an object of the present invention to provide an improved photo-selective plating method.

It is a further object of the present invention to provide a photoselective electroless plating system employing a catalyst system which does not require the use of short wavelength ultraviolet light.

These and other objects of the present invention will become apparent to those skilled in the art from the accompanying detailed description of the invention.

SUMMARY OF THE INVENTION

The present invention consists of a method for photoselective metal deposition of a precious metal onto a titanium containing semiconductor substrate. The precious metal is chosen from the group consisting of palladium, platinum, gold, silver, osminum, indium, iridium, rhenium, and rhodium. The substrate includes a material capable of absorbing light having a wavelength greater than 300 nm and transferring energy to metal ions of a salt of a metal chosen from the group consisting tin, titanium, and lead, the oxidation state of the metal ion thereof being alterable by exposure to short wavelength ultraviolet light. The surface of said substrate is coated with a solution containing a salt of a metal selected from the group consisting of tin, titanium, and lead, the oxidation state of the metal ion thereof being alterable by exposure to short wavelength ultraviolet light. The regions of said substrate which are not to receive said precious metal are then exposed to light having a wavelength less than 390, but greater than 300 nm. Finally, the substrate is exposed to a solution the salt of said precious metal.

DETAILED DESCRIPTION OF THE INVENTION

The present invention consists of a photo-selective metal deposition process which utilizes the above described photo-oxidation procedure to form a metallic pattern on a substrate. In contrast to the prior art methods which utilize ultraviolet light having a wavelength less than 300 nm, the method of the present invention utilizes ultraviolet light having a wavelength of typically 366 nm. This longer wavelength ultraviolet light is not absorbed by conventional mylar photographic masks or conventional optical lenses. Hence, the method of the present invention provides a significant cost savings over the prior art methods by allowing such photographic masks and conventional optics to be used in the patterning process.

The use of this longer wavelength is made possible by the incorporation of a substance into the substrate which absorbs this longer wavelength ultraviolet light. This substance aids in the oxidation of the metal ions used in the reduction of the precious metal. For example, when stannous ions are used as the photo-promoter, the incorporated substance causes stannous ions to be oxidized to stannic ions by absorbing the long wavelength ultraviolet light and transferring the energy to the stannous ions. The substance in question must be able to absorb light at a wavelength longer than that of the $SnCl_2$ absorption edge and transfer that energy to the absorbed $SnCl_2$ in a manner which results in the photo-oxidation of the stannous ions to stannic ions. Although the exact mode of energy transfer is not known, it is believed that the surface of the substrate after the incorporation of the substance in question must be a semiconductor material with a band gap energy which is less than the energy of the long wavelength ultraviolet light. Titanium compounds are the preferred substances for incorporating into the substrate.

It can be seen from the following example that incorporation of titanium into the substrate enables patterning of the substrate using long wavelength ultraviolet light. Five flat samples of different substrates were patterned using the $SnCl_2/PdCl_2$ photooxidation procedure at an ultraviolet light wavelength of 366 nm. Two of these samples contained titanium, the others did not. The two samples containing titanium were successfully patterned, the samples lacking titanium were not.

The titanium containing samples used in this experiment were lead zirconate titanate, strontium titanate. The non-titanium containing samples were fused silica, aluminum oxide, and lead zirconate. Each sample was prepared for patterning by soaking in a $SnCl_2$ consisting of 10 grams of $SnCl_2$ plus 10 ml of concentrated hydrochloric acid per liter of water. The samples were allowed to soak for five minutes, after which they were removed from the bath and air dried. The dried samples were each covered with a mylar photographic mask having a pattern consisting of opaque lines separated by clear spaces. The line width was 165 microns. The samples were then exposed to ultraviolet light having a wavelength of 366 nm for five minutes. The ultraviolet light sources was a 4 watt mercury light source. After this exposure, the samples were transferred to a $PdCl_2$ bath consisting of 2 grams of $PdCl_2$ and 5 ml of concentrated hydrochloric acid per liter. While in this second bath, the unoxidized $SnCl_2$ remaining on the sample's surface reacted with the $PdCl_2$ to form metallic Pd according to reaction (1) described above. The samples were then removed from the $PdCl_2$ bath and rinsed with water. Finally, the samples were transferred to a conventional electroless nickel plating solution for ten minutes. A pattern consisting of 165 micron nickel lines was formed on the titanium containing substrates. In contrast, the other samples were completely covered with nickel. The above procedure has been repeated using barium titanate and strontium titanate samples with similar results. The barium titanate samples included samples which had been donor doped to be n-type semiconductors. The strontium samples included both single crystal and doped strontium titanate, i.e., both n-type and p-type semiconductors. Lead zirconate titanate and non-doped strontium titanate are also semiconductors.

The above plating procedure has also been repeated with titanium oxide. Unlike the other titanium containing substrates, the titanium oxide could not be patterned using the long wavelength ultraviolet light. In contrast to the above mentioned titanium compounds, titanium oxide is not a semiconductor. Hence, although the exact mechanism by which the titanium transfers energy to the photo-promoter is not known, it is believed that the surface of the substrate must be a semiconductor. However, not all semiconductors can be photo-patterned in this manner. For example, neither p-doped silicon not n-doped silicon has been successfully patterned using the long wavelength ultraviolet light.

As noted above, the prior art teaches a number of different photopromoters for use at ultraviolet light wavelengths below 300 nm. Titanium is among these. That is, a solution of titanous chloride could be used in place of the stannous chloride solution in the reaction shown in Eq. (1). However, the titanium contained in the ceramic is not acting as the sole photopromoter. It has been found experimentally that, if the stannous chloride coating used in the above cited experiments is omitted, no photoactivation takes place. Hence, to obtain photoactivation at the longer ultraviolet light wavelengths, both a photopromoter of the type described by DeAngeleo and a titanium containing substrate are needed.

The longest wavelength ultraviolet light which may be used in the present invention depends on the titanium compound which is contained in the substrate to be patterned. The longest wavelength ultraviolet light is determined by the wavelengths in the absorption bands of the titanium compound in question. The wavelengths corresponding to these absorption bands vary with the chemical form of the titanium in the substrate. For example, the edge of the absorption band in question in lead zirconate titanate is corresponds to a wavelength of about 390 nm; hence ultraviolet light having a wavelength less than 390 nm must be used to pattern lead zirconate titanate.

Accordingly, there has been described a method for the photopatterned plating of substrates using long wavelength ultraviolet light. Various modifications in additional to those described above will readily be apparent to those skilled in the art. The scope of the present invention is therefore defined only by the following appended claims.

What is claimed is:

1. A method for photoselective metal deposition of a precious metal chosen from the group consisting of palladium, platinum, gold, silver, osmium, indium, iridium, rhenium, and rhodium, said method comprising the steps of:

providing a semiconductor substrate for receiving said previous metal said substrate including a material capable of absorbing light having a wavelength greater than 300 nm and transferring energy to metal ions of a salt of a metal chosen from the group consisting of tin, titanium, and lead, the oxidation state of the metal ion thereof being alterable by exposure to light having a wavelength less than 300 nm;

coating the surface of said substrate with a solution containing a salt of a metal selected from the group consisting of tin, titanium, and lead, the oxidation state of the metal ion thereof being alterable by exposure to light having a wavelength less than 300 nm, the oxidation state of said metal ion remaining substantially unaltered when said solution is exposed to light having a wavelengths greater than 300 nm;

exposing the regions of said substrate which are not to receive said precious metal to light having a wavelength less than 390, but greater than 300 nm; and exposing said substrate to a solution of the salt of said precious metal.

2. The method of claim 1 wherein said semiconductor substrate is coated with is $SnCl_2$.

3. The method of claim 1 wherein said semiconductor substrate contains titanium.

4. The method of claim 3 wherein said included material is strontium titanate.

5. The method of claim 3 wherein said included material is barium titanate.

6. The method of claim 3 wherein said included material is lead titanate.

7. The method of claim 3 wherein said included material is lead zirconate titanate.

* * * * *

UNITED STATES PATENT AND TRADEMARK OFFICE
CERTIFICATE OF CORRECTION

PATENT NO. : 4,738,869
DATED : April 19, 1988
INVENTOR(S) : Charles E. Baumgartner It is certified that error appears in the above-identified patent and that said Letters Patent is hereby corrected as shown below:

In column 2, line 49, after "solution" insert --of--.

In column 4, line 6, delete "not" and insert therefor --nor--.

In column 4, line 32, delete "is".

In column 4, line 39, delete "additional" and insert therefor --addition--.

In column 4, line 50, delete "previous" and insert therefor --precious--.

In column 4, line 65, delete "wavelengths" and insert therefor --wavelength--.

Signed and Sealed this

Twentieth Day of September, 1988

Attest:

DONALD J. QUIGG

*Attesting Officer*      *Commissioner of Patents and Trademarks*